(12) United States Patent
Yanagisawa et al.

(10) Patent No.: US 7,005,032 B2
(45) Date of Patent: Feb. 28, 2006

(54) WAFER TABLE FOR LOCAL DRY ETCHING APPARATUS

(75) Inventors: Michihiko Yanagisawa, Sagamihara (JP); Kazuyuki Tsuruoka, Zama (JP); Chikai Tanaka, Atsugi (JP)

(73) Assignee: Speedfam Co., Ltd., Kanagawa-Pref. (JP)

( * ) Notice: Subject to any disclaimer, the term of this patent is extended or adjusted under 35 U.S.C. 154(b) by 403 days.

(21) Appl. No.: 10/098,588

(22) Filed: Mar. 18, 2002

(65) Prior Publication Data

US 2002/0139482 A1  Oct. 3, 2002

(30) Foreign Application Priority Data

Mar. 30, 2001  (JP)  ............................. 2001-098034

(51) Int. Cl.
H01L 21/302   (2006.01)
H01L 21/3065  (2006.01)
H01L 21/00    (2006.01)
C23C 16/00    (2006.01)

(52) U.S. Cl. .......................... 156/345.51; 156/345.33; 156/345.39; 216/58; 216/67; 216/71; 438/706; 438/710; 438/711; 438/712; 438/719; 438/730

(58) Field of Classification Search .......... 156/345.51, 156/345.33, 345.39; 216/58, 67, 71; 438/706, 438/710, 711, 712, 719, 730
See application file for complete search history.

(56) References Cited

U.S. PATENT DOCUMENTS 5,980,769 A * 11/1999 Yanagisawa et al. ......... 216/67
6,136,213 A * 10/2000 Shinozuka et al. ........... 216/58

FOREIGN PATENT DOCUMENTS

JP  09-027482   1/1997
JP  2001-04674  2/2001

* cited by examiner

Primary Examiner—Ram N Kackar
(74) Attorney, Agent, or Firm—Morrison & Foerster LLP

(57) ABSTRACT

To resolve a problem that an etching rate profile is changed by a position of a nozzle relative to a semiconductor wafer and accordingly, at a vicinity of an outer edge of the semiconductor wafer, an accurate machining result is difficult to achieve, gas including activated species produced by plasma is blown from a nozzle locally to a surface of the semiconductor wafer W supported on a wafer table concentrically therewith to thereby remove unevenness on the surface of the semiconductor wafer. In this case, the wafer table is provided with a radius larger than a radius of the semiconductor wafer supported thereby by an outstretched portion to thereby prevent an outer edge from being removed excessively by reflected gas.

4 Claims, 5 Drawing Sheets

POSITION FROM WAFER EDGE
(RECTANGULAR SHAPE)

WAFER TABLE FOR LOCAL DRY ETCHING APPARATUS

BACKGROUND OF THE INVENTION

1. Field of the Invention

The present invention relates to a local etching method and a local etching apparatus for making a thickness distribution of a semiconductor wafer uniform by locally etching to planarize a projected portion of a surface of a semiconductor wafer, or locally etching a relatively thick portion of a semiconductor wafer by blowing activated species gas.

2. Description of the Related Art

FIG. 1 is an explanatory view for explaining principle of a wafer planarizing method by a local etching method using plasma. Notation 100 designates a plasma generating portion and activated species gas G in plasma generated at the plasma generating portion 100 is injected from a nozzle 101 to a surface of a semiconductor wafer W. The semiconductor wafer W is fixedly mounted onto a stage 120 and the stage 120 is moved at speed controlled in a horizontal direction relative to the nozzle 101.

Initially, a thickness of the semiconductor wafer W differs in accordance with a location of the surface. Prior to etching, for a semiconductor wafer W, a thickness of each subdivided area thereof is measured. By the measurement, there is provided data corresponding a position of the respective area and the thickness of the position, that is, position-thickness data. According to the local etching method, an amount of removing a material at the respective region corresponds to a time period of exposing the area to the activated species gas G. Therefore, relative speed for passing the nozzle relative to the semiconductor wafer (hereinafter, referred to as nozzle speed) is determined to speed by which the nozzle is moved at a low speed above a relatively thick portion (hereinafter, referred to as relatively thick portion) Wa and at relatively high speed at a relatively thin portion.

FIG. 2 is a graph showing a distribution of an amount (depth) of a semiconductor wafer material per unit time removed by the activated species gas injected from the nozzle 101, that is, an etching rate. The curve referred to as an etching rate profile is a curve very similar to a Gaussian distribution. As shown in FIG. 2, the etching rate E is provided with a maximum value Emax on a center line of the nozzle 101 and is reduced as the location becomes remote from the center in a radius r direction.

Further, normally, the half value width is used as an index of a diameter of etching (that is, index which does not critically indicate a range to which etching effects but simply expressing a smoothly changing etching rate). In this specification, a half of the half value width is referred to as half value radius.

Since material removing capacity shows a distribution in accordance with a distance from the center of the nozzle in this way, a material removing amount requested for one area cannot be determined only by speed of the nozzle at the one area. The reason is that even when the material is removed by a necessary amount in the one area, when etching is carried out for a contiguous area or an area contiguous thereto, the material is removed in accordance with the above-described etching rate profile also for the initial area.

In this way, a single area is effected with influence of etching for all of the other areas and therefore, the speed of the nozzle is calculated such that heights of surfaces of the respective areas become equal to each other as a result of superposing material removing amounts by influence of these for all the areas.

Conventionally, the above-described etching rate profile has been considered to always remain unchanged regardless of the position of the nozzle relative to the semiconductor wafer W. Further, it has been found that considerable dissociation is observed between a material removing amount calculated based on the premise and a material removing amount actually provided, particularly at a location proximate to an outer edge of the semiconductor wafer as is seen in FIG. 3. That is, it has been found that there is observed a tendency that an accurate result of working is difficult to obtain at the vicinity of the outer edge. Further, FIG. 3 shows a behavior in which the material of a corner portion of the semiconductor wafer surrounded by a dotted line is excessively removed at a portion surrounded by the dotted line and intended planarization is not provided.

As a result of various experiments, there is provided knowledge that the dissociation is caused by deforming the etching rate profile at the vicinity of the outer edge of the semiconductor wafer. The inventors have proposed a local dry etching method (Japanese Patent Application 2001-047674) in consideration of the deformation of the etching rate profile based on the knowledge.

It is the problem of the invention to provide a local dry etching method by a method different from the above-described local dry etching method.

SUMMARY OF THE INVENTION

The above-described problem is resolved by the following means. That is, according to an aspect of the invention, there is provided a local dry etching apparatus or a local etching apparatus or a wafer table therefor for removing unevenness on a surface of a semiconductor wafer by blowing a gas including an activated species produced by a plasma and injected from a nozzle locally to the surface of the semiconductor wafer supported on a wafer table concentrically therewith wherein the wafer table is provided with a supporting face in a circular shape and a radius larger than a radius of the semiconductor wafer supported by the wafer table. Further, according to another aspect of the invention, a value produced by subtracting the radius of the semiconductor wafer from the radius of the wafer table is large by an amount of 10 percent through 40 percent with a half value width of an etching rate of the injected gas as a reference. Further, according to another aspect of the invention, the radius of the wafer table is larger than the radius of the semiconductor wafer by 4 mm through 10 mm.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute apart of the specification, illustrate embodiments of the invention and together with the description, serve to explain the principles of the invention.

DETAILED DESCRIPTION OF THE PREFERRED EMBODIMENTS

Now, preferred embodiments of the present invention will be described in detail while referring to the accompanying drawings.

Figure 4:
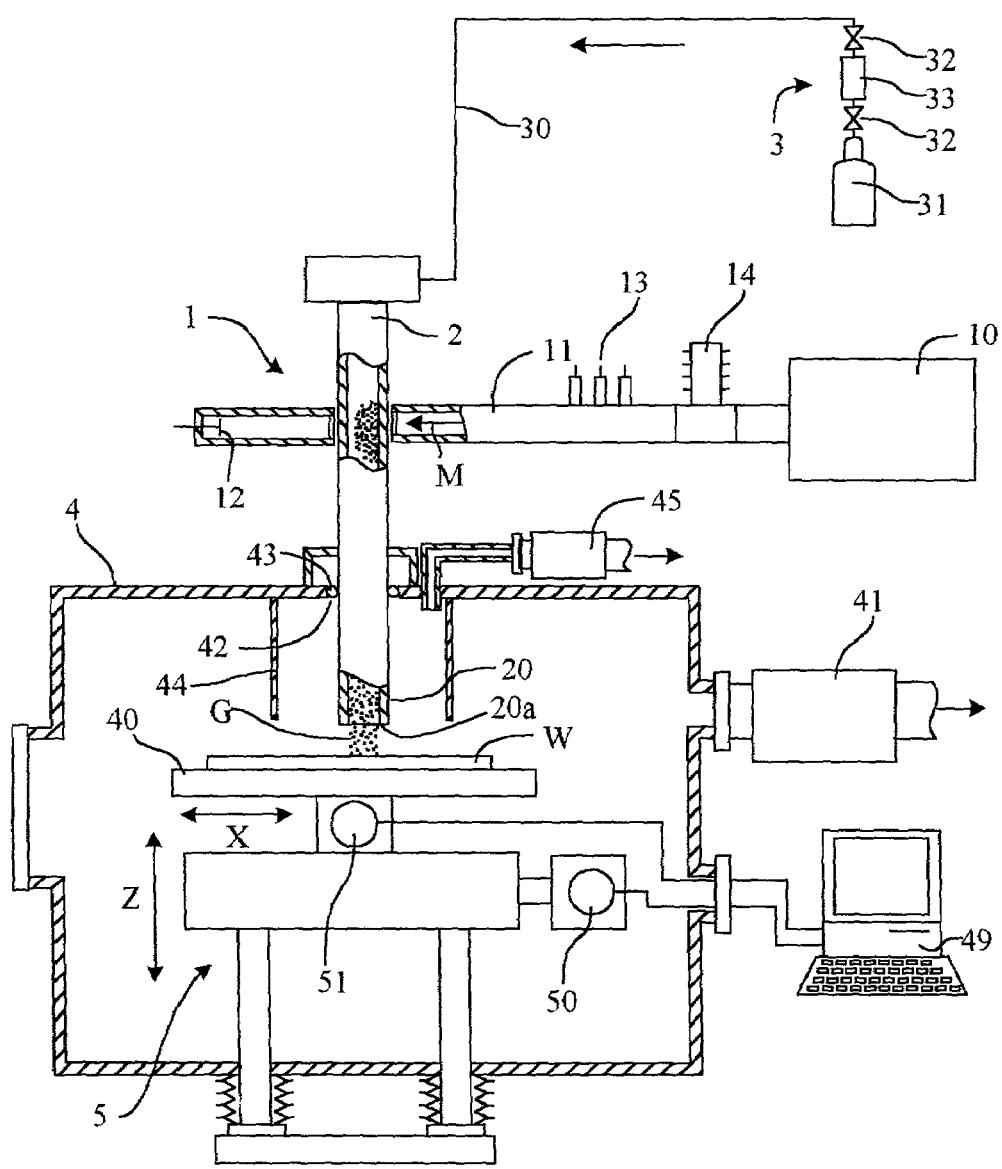
FIG. 4 is an explanatory view showing an outline of a local etching apparatus.

FIG. 4 is an explanatory view showing an outline of a local etching apparatus for removing unevenness at a surface of a semiconductor wafer.

The local etching apparatus is provided with a plasma generator 1, a gas supply apparatus 3 and an X-Y drive mechanism 5. The plasma generator 1 is an apparatus for forming a gas in an alumina discharge tube 2 into a plasma to thereby produce activated species gas G including neutral radicals and is provided with a microwave oscillator 10 and a waveguide 11. The microwave oscillator 10 is a magnetron and can oscillate microwave M at predetermined frequency.

The waveguide 11 propagates the microwave M oscillated from the microwave oscillator 10 and the alumina discharge tube 2 is inserted to the waveguide 11. At an inner portion of a left side end of the waveguide 11, there is attached a reflecting plate (short plunger) 12 forming a standing wave by reflecting the microwave M. Further, at middle of the waveguide 11, there are attached a stub tuner 13 for carrying out phase matching of the microwave M and an isolator 14 for bending the reflected microwave M directed to the microwave oscillator 10 in a direction of 90 degrees.

The alumina discharge tube 2 is a cylindrical member formed with a nozzle 20 at its lower end portion and connected with a supply pipe 30 of the gas supply apparatus 3 at its upper end portion. The gas supply apparatus 3 is an apparatus for supplying a gas into the alumina discharge tube 2, having a cylinder 31 of $SF_6$ (sulfur hexafluoride) gas and the cylinder 31 is connected to the supply pipe 30 via valves 32 and a flow rate controller 33. Further, although the sulfur hexafluoride gas can constitute a gas by itself in this way, a mixture gas including the sulfur hexafluoride gas can also be constituted by simultaneously supplying other gas to the supply pipe 30.

When gas is supplied from the gas supply apparatus 3 to the alumina discharge tube 2 and the microwave M is oscillated by the microwave oscillator 10, plasma formation of the gas is carried out at inside of the alumina discharge tube 2. The activated species gas G produced by the plasma formation is injected from the nozzle 20.

The semiconductor wafer W is formed substantially in a circular shape, arranged on a wafer table 40 in a circular shape at inside of a chamber 4 concentrically therewith and adsorbed thereby by electrostatic force. The chamber 4 is attached with a vacuum pump 41 and inside of the chamber 4 can be vacuumed (reduce pressure) by the vacuum pump 41. Further, a hole 42 is perforated at a central portion of an upper face of the chamber 4 and the nozzle 20 of the alumina discharge tube 2 is inserted into the chamber 4 via the hole 42. An O-ring 43 is mounted between the hole 42 and the alumina discharge tube 2 to thereby hold an interval between the hole 42 and the alumina discharge tube 2 in airtight. A duct 44 is provided at a surrounding of the nozzle 20 inserted into the hole 42. Another vacuum pump 45 is connected to the duct 44 and gases produced by reaction in etching are exhausted to out side of the chamber 4 via the duct 44.

The X-Y drive mechanism 5 is arranged at inside of the chamber 4 and supports the wafer table 40 from a lower side thereof. According to the X-Y drive mechanism 5, the wafer table 40 is moved in a left and right direction of FIG. 4 by an X drive motor 50 thereof and the wafer table 40 and the X drive motor 50 are integrally moved in a top and tail direction of the paper face by a Y drive motor 51 thereof. That is, the nozzle 20 can be moved in X-Y directions relative to the semiconductor wafer W by the X-Y drive mechanism 5.

When the valve 32 of the gas supply apparatus 3 is opened, the $SF_6$ gas in the cylinder 31 flows out to the supply pipe 30 and is supplied to the alumina discharge tube 2. The flow rate of the $SF_6$ gas is adjusted by an opening degree of the valve 32.

In parallel with operation of supplying the $SF_6$ gas or the mixture gas, the microwave oscillator 10 is driven. The $SF_6$ gas at inside of the alumina discharge tube 2 is subjected to plasma formation by the microwave M. By the plasma formation of the gas, there is formed the activated species gas G including neutral F (fluorine) radicals. The activated species gas G is guided to the nozzle 20 of the alumina discharge tube 2 and is injected from an opening 20a of the nozzle 20 to the surface of the semiconductor wafer W.

In parallel with injection of the activated species gas, the X-Y drive mechanism 5 is controlled by a control computer 49 and the wafer table 40 is moved by previously calculated speed along a determined locus.

The injected activated species gas chemically reacts with a material on the surface of the semiconductor wafer. Produced substances produced by the chemical reaction are gaseous and accordingly, the produced gases can easily be removed (flowed away) from the side. Thereby, material is removed from the surface of the semiconductor wafer W. A removed amount thereof is substantially proportional to a time period of being exposed to the activated species gas and therefore, the removed amount is controlled by controlling relative speed between the semiconductor wafer W and the nozzle 20. The relative speed is determined based on previously measured data of unevenness of the semiconductor wafer W, that is, position-thickness data.

The invention is based on new knowledge that the conventional way of thinking of regarding the etching rate profile as always axially symmetrical, is partially erroneous, instead thereof, the etching rate profile is dependent on a distance between the center of the nozzle and an outer edge of the semiconductor and relatively relates to respective radii of the semiconductor wafer W and the wafer table 40 supporting the semiconductor wafer W.

Figure 5:
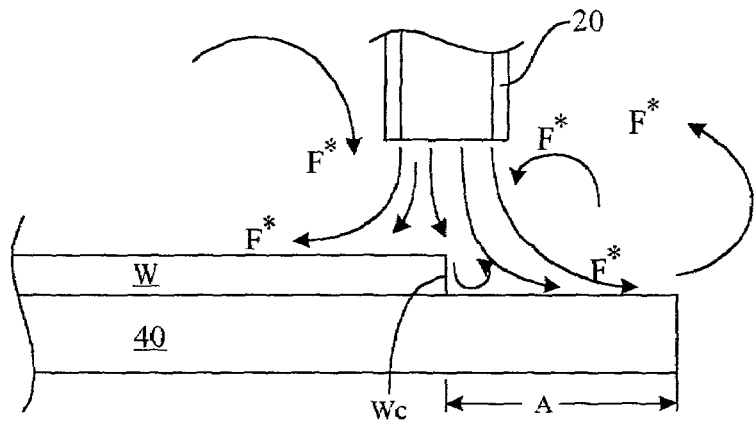
FIGS. 5 to 7 are explanatory views for explaining flow of gas around a semiconductor wafer and a wafer table supporting the semiconductor wafer.
Figure 6:
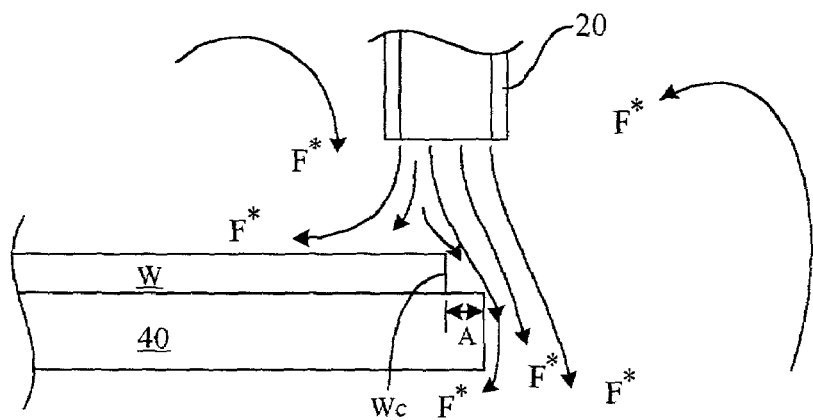
Figure 7:
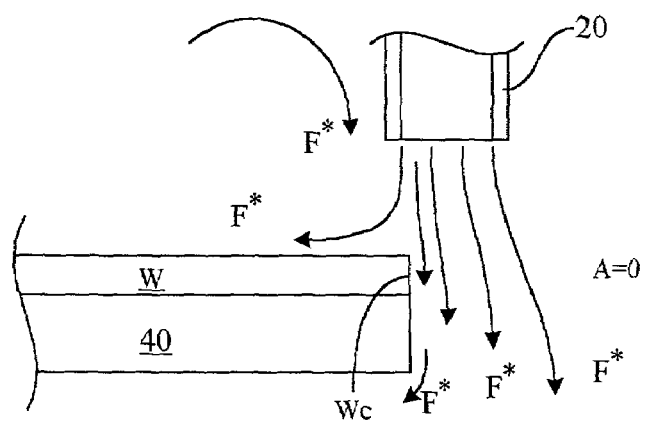

FIG. 5, FIG. 6 and FIG. 7 are explanatory views for showing the nozzle 20, the semiconductor wafer W, the wafer table 40 supporting the semiconductor wafer W and a flow of the gas. These drawings show how the flow of the gas is changed in accordance with a portion of the wafer table 40 outstretched to an outer side of an outer edge Wc (outstretched portion) A by taking an example when the nozzle 20 is disposed above the outer edge Wc. In the drawings, arrow marks designate the flow and notation F* designates the activated species.

When the nozzle 20 and the outer edge Wc are sufficiently remote from each other (when the nozzle is disposed at the central portion of the wafer), in looking at the surface of the semiconductor wafer by placing the observing point on the nozzle 20, the surface looks like a simple plane substantially having infinite spread and having no characteristic. Therefore, the activated species gas injected from the nozzle 20 is impacted to the semiconductor wafer to thereby change a direction of the flow and thereafter flows to uniformly spread along the surface of the semiconductor wafer. Therefore, the flow of the activated species gas is symmetrical with respect to the central axis of the nozzle 20 and therefore, the etching rate E is also symmetrical with respect to the nozzle axis.

However, at a position approaching the outer edge Wc of the semiconductor wafer, the situation differs from the above-described. The flow of the activated species gas is influenced by the shape of the semiconductor wafer. At the position proximate to the outer edge Wc of the semiconductor wafer, in looking at the surface of the semiconductor wafer by placing the observing point on the central axis of the nozzle 20, the outer edge Wc and the outstretched portion A are brought into the field of vision and the semiconductor wafer can no longer be regarded as the plane having the infinite spread and having no characteristic. Therefore, the flow of the activated species gas is not axially symmetrical and the distribution of the etching rate E is not axially symmetrical. That is, the etching rate profile is deformed.

The deformation of the etching rate profile is caused by still other factor. When the activated species gas is blown to the semiconductor wafer, the activated species in the gas collide with silicon atoms at a constant frequency and cause chemical reaction. The activated species become other compound (gases) by the chemical reaction and lose the activity. When a comparison is made between the activated species gas staying for a long period of time in a space proximate to the surface of the semiconductor wafer and the activated species gas staying in a space remote from the surface of the semiconductor wafer, rates of the activated species included therein differ from each other. Therefore, when attention is paid to an arbitrary block of the activated species gas, the chemical activity as a whole differs for respective block.

Meanwhile, the flow of the gas is provided with a random performance and there is produced an irregular and complicated flow at inside of the chamber of the local etching apparatus. Mixing is caused between new gas immediately after having been injected into the chamber and old gas in which the concentration of the activated species is reduced after elapse of some period of time after injection. Therefore, a portion of gas (or activated species) impacted to the semiconductor wafer is recirculated to a vicinity of the nozzle and joins and mixes with new gas at the vicinity. When the activated species gas flows on the outer side of the outer edge Wc of the semiconductor wafer, the activated species are not consumed since silicon is not present at the outer side.

When the gas in which the activated species are not consumed in this way, drifts at inside of the chamber, approaches the nozzle and mixes with new gas immediately after having been injected, the rate of the activated species is increased. Therefore, the activity of the activated species gas is increased and when the gas is blown to surface of the semiconductor wafer, the etching rate is partially increased. As a result, the etching rate profile is deformed.

Figure 3:
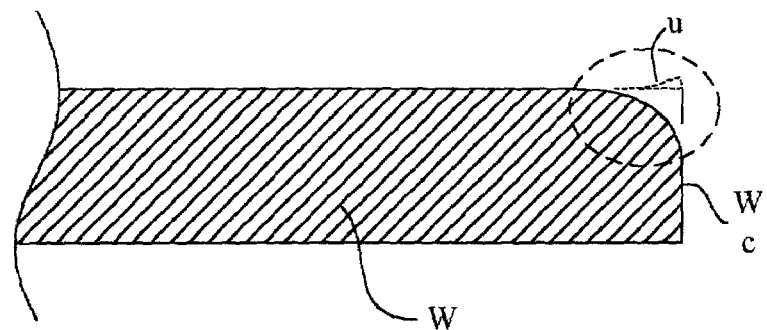
FIG. 3 is an explanatory view for explaining a dissociation between a calculated material removing apparatus and a material removing amount actually provided, particularly observed at a vicinity of an outer edge of a semiconductor wafer.

Further, the size of the outstretched portion A significantly influences on the flow in the chamber. As shown in FIG. 5, when the outstretched portion A is large, the gas is reflected by the outstretched portion A and a flow circulated to the nozzle 20 is liable to be produced. The material of the outstretched portion A hardly reacts chemically with the activated species (such a material is selected) and therefore, when the gas is reflected, the activated species in the gas are hardly dissipated at the out stretched portion A. Since the gas the activated species of which are not dissipated, is circulated to the nozzle 20 and accordingly, when the gas joins with new gas, on the right side of the nozzle 20 of FIG. 5, the rate of the activated species is high and is low on the opposed side (left side). Therefore, the outer edge portion of the wafer W is liable to be etched excessively as shown in FIG. 3 (bold line).

FIG. 6 shows an example when the outstretched portion A is very small and FIG. 7 shows an example when the outstretched portion A is nullified, that is, the wafer diameter and the table diameter are equal to each other. As shown in the drawings, the gas is hardly reflected or is not reflected at all and flows away to the lower side of the wafer table 40. Further, at this occasion, the gas flows away to attract even a portion on the left side of the flow of the gas. The flowed-away gas may be recirculated to a vicinity of the nozzle 20 by other circulation flow in the chamber 4. However, with elapse of time, the activity is lost (by elapse of time, activated species are not activated species) and therefore, when the gas joins with new gas, the rate of the activated species in the gas is lowered. Therefore, contrary to the case of FIG. 5, at the outer edge portion, the amount of removing the material is reduced and the outer edge portion is edged as shown in a dotted line u in FIG. 3.

Figure 1:
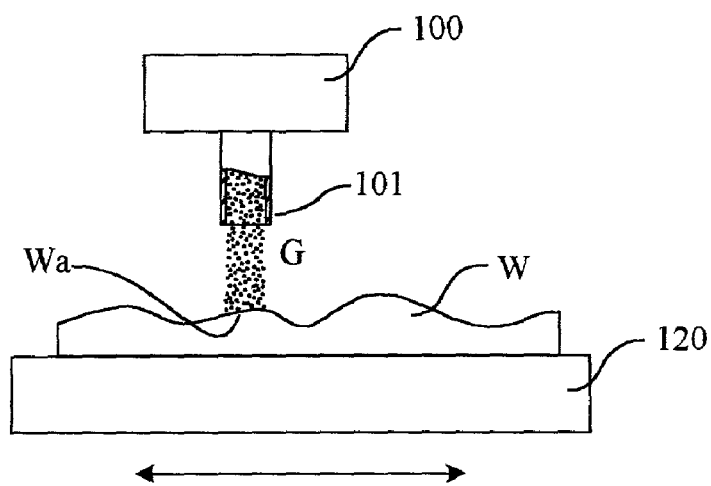
FIG. 1 is an explanatory view for explaining principle of a wafer planarizing method by a local etching method using plasma.
Figure 2:
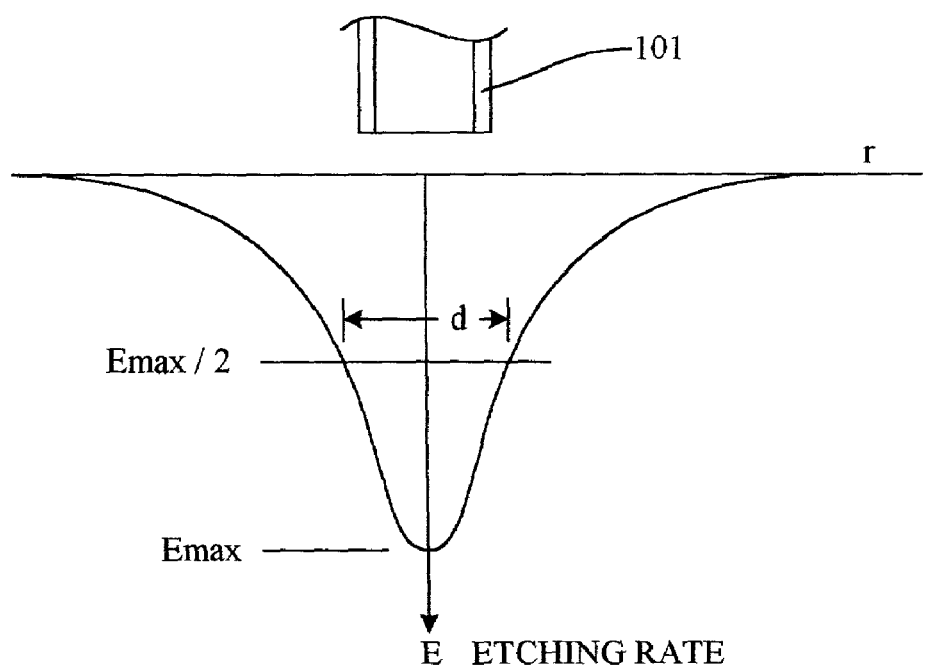
FIG. 2 is a graph showing a distribution of an amount (depth, etching rate) of a semiconductor wafer material per unit time removed by activated species gas injected from a nozzle.
Figure 8:
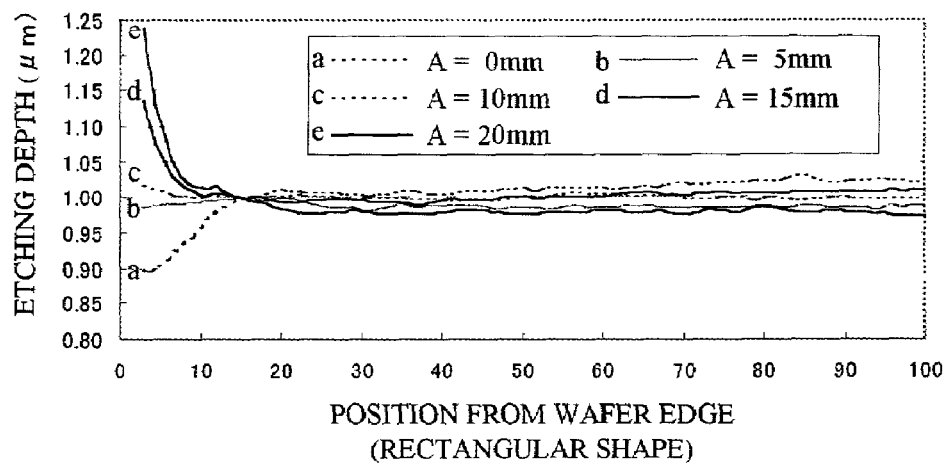
FIG. 8 illustrates graphs showing material removing amounts, that is, etching depths for various sizes of an outstretched portion A.

FIG. 8 illustrates graphs representing material removing amounts, that is, etching depths with regard to various sizes of the outstretched portion A. Here, there are shown etching depths provided when the half value width d of the etching rate profile (FIG. 2, width of etching rate profile providing material removing capacity of a half of Emax) is set to 25 mm, the section of the wafer table 40 is set to be rectangular and the size of the outstretched portion A (dimension A) is set to a: 0 mm, b: 5 mm, c: 10 mm, d: 15 mm and e: 20 mm.

Further, the abscissa designates a position on the wafer with the outer edge Wc as a reference. As is apparent from the drawing, in the case of a (A=0 mm), the etching depth is deficient, in the cases of b (A=5 mm) and c (A=10 mm), the etching depths substantially fall in a range as intended and in the cases of d (A=15 mm) and e (A=20 mm), the etching depths become excessive.

Figure 9:
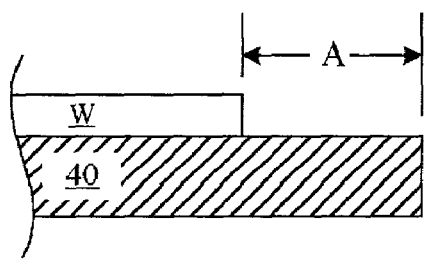
FIG. 9 is a sectional view showing an example in which a wafer table is formed in a sectional shape of a rectangular shape.
Figure 10:
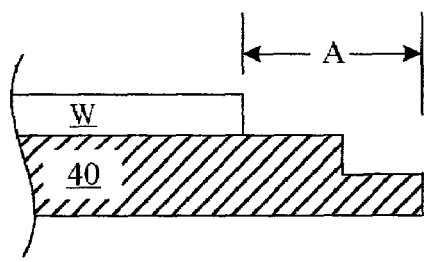
FIG. 10 is a sectional view showing other example in which a wafer table is formed in a sectional shape of a stepped shape.
Figure 11:
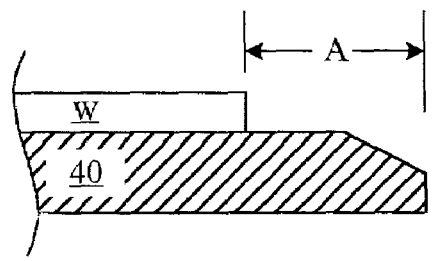
FIG. 11 is a sectional view showing other example in which a wafer table is formed in a sectional shape of a slope shape.
Figure 12:
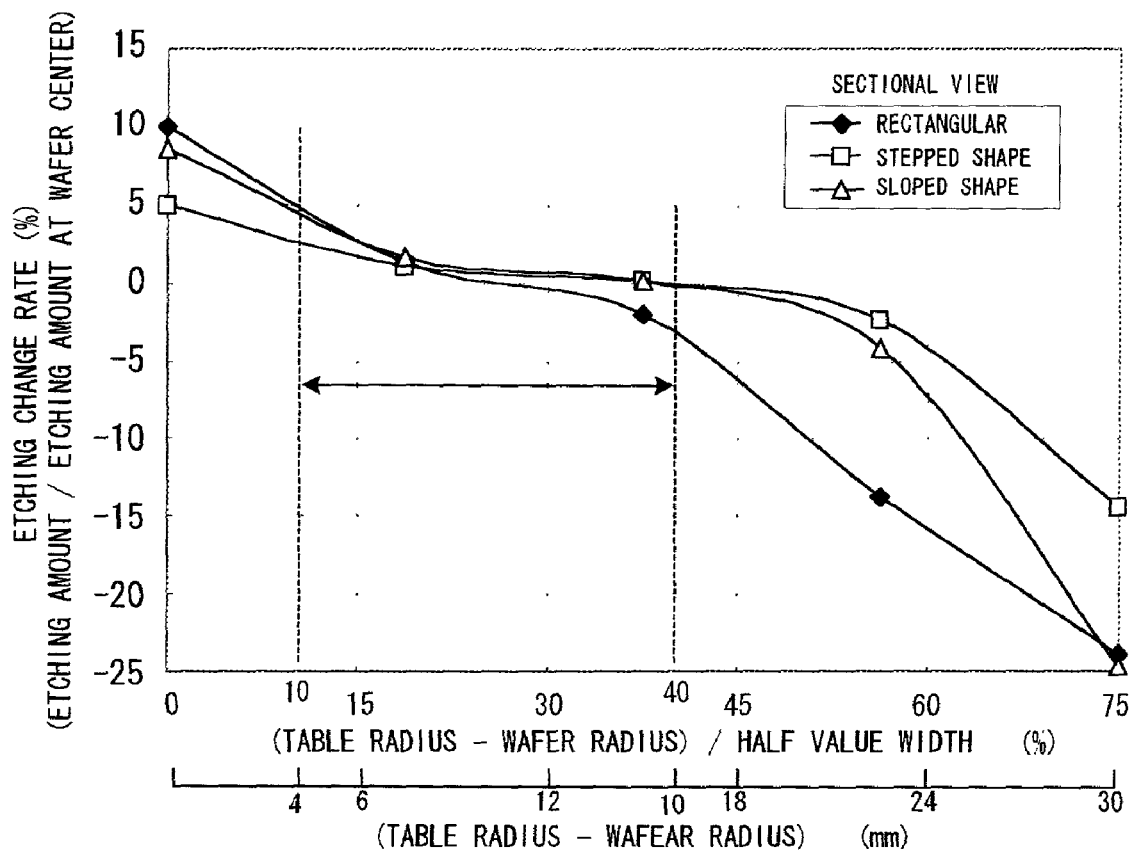
FIG. 12 illustrates graphs in which outer periphery etching change rates are expressed by %.

With regard to cases in which the wafer table 40 is provided with different sectional shapes, an investigation is carried out on influence of the shapes. FIG. 9 shows an example of a shape of the wafer table 40 having a section in a flat shape (rectangular shape), FIG. 10 shows an example of a shape of the wafer table 40 having a section of a stepped difference shape (shape of step) and FIG. 11 shows an example of a shape of the wafer table 40 having a section in a slope shape. FIG. 12 illustrates graphs in which the abscissa designates a value produced by dividing a difference between the radius of the wafer table 40 and the radius of the wafer W by the half value width d (in percent, the half value width d constitutes the reference) and the ordinate designates an outer periphery etching change rate in percent. The outer periphery etching change rate designates an amount of removing the outer edge Wc with an etched amount at the center of the wafer W as a reference.

Figure 13A:
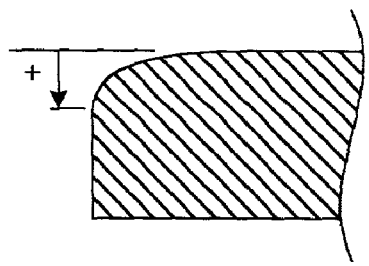
FIGS. 13a and 13b are sectional views showing positiveness and negativeness of the outer periphery etching rate and vicinities of outer edges of etched wafers.
Figure 13B:
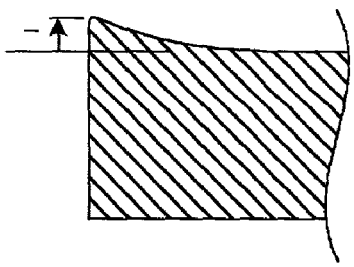

FIGS. 13a and 13b are sectional views showing positiveness and negativeness of the outer periphery etching rate and vicinities of outer edges of etched wafers, showing that when the outer periphery etching rate is positive, the outer edge Wc slopes down as shown in FIG. 13a and when the outer etching rate is negative, a deficiency in etching is caused at the vicinity of the outer edge Wc as shown in FIG. 13b.

Although when the sectional shape of the wafer table 40 differs, the graph of the outer peripheral etching change rate differs, in a range of the value of the abscissa from 10 percent to 40 percent, the outer periphery etching change rate indicates almost 0 irrespective of the sectional shape. That is, it is known that when the value of the abscissa falls in this range, the outer edge Wc is not etched excessively, nor underetched and proper etching is carried out. When the range of the abscissa is indicated by the dimension of the outstretched portion A, A=4 mm through 10 mm.

Further, when the radius of the wafer table 40 is made smaller than the radius of the semiconductor wafer W, the gas detours to the overhung portion of the wafer and removes the material at the lower portion of the outer edge Wc and therefore, another problem is posed and accordingly, such a supporting method cannot be adopted.

According to the invention, the deformation of the etching rate profile is prevented by adjusting the radius of the wafer table relative to the radius of the semiconductor wafer based on the knowledge that the etching rate profile is deformed at the vicinity of the outer edge of the semiconductor wafer.

Therefore, in local dry etching of the semiconductor wafer, there is achieved an effect of capable of effectively preventing occurrence of a phenomenon that the outer edge slopes down or rises by the simple structure.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A local dry etching apparatus for removing unevenness on a surface of a semiconductor wafer, comprising:
   a nozzle from which a gas including an activated species produced by a plasma is injected locally to the surface of the semiconductor wafer; and
   a wafer table supporting the semiconductor wafer concentrically thereon, a radius of the wafer table being larger than a radius of the semiconductor wafer
   wherein a difference between the radius of the semiconductor wafer and the radius of the wafer table is 10 to 40 percent of a half value width of an etching rate distribution peak of the gas injected from the nozzle.

2. The local dry etching apparatus of claim 1, wherein the radius of said wafer table is larger than the radius of said semiconductor wafer by 4mm to 10 mm.

3. A wafer table for a local dry etching apparatus for removing unevenness on a surface of a semiconductor wafer by injecting a gas including an activated species produced by a plasma through a nozzle locally to the surface of the semiconductor wafer supported on and concentric with the wafer table,
   wherein a radius of the wafer table is configured to be larger than a radius of the semiconductor wafer supported on the wafer table so that a difference between the radius of the semiconductor wafer and the radius of the wafer table is 10 to 40 percent of a half value width of an etching rate distribution peak of the gas injected from the nozzle.

4. The wafer table of claim 3, wherein the radius of the wafer table is larger than the radius of said semiconductor wafer by 4mm to 10 mm.

* * * * *